United States Patent
Hashimoto et al.

(10) Patent No.: US 10,843,445 B2
(45) Date of Patent: Nov. 24, 2020

(54) MATCHED-TYPE ELECTROMAGNETIC WAVE ABSORBER

(71) Applicant: TOMOEGAWA CO., LTD., Tokyo (JP)

(72) Inventors: Takeshi Hashimoto, Shizuoka (JP);
Takuma Hattori, Shizuoka (JP);
Kojiro Tsuruta, Shizuoka (JP)

(73) Assignee: Tomoegawa Co., Ltd., Tokyo (JP)

( * ) Notice: Subject to any disclaimer, the term of this patent is extended or adjusted under 35 U.S.C. 154(b) by 267 days.

(21) Appl. No.: 15/778,516

(22) PCT Filed: Nov. 22, 2016

(86) PCT No.: PCT/JP2016/084631
§ 371 (c)(1),
(2) Date: May 23, 2018

(87) PCT Pub. No.: WO2017/090623
PCT Pub. Date: Jun. 1, 2017

(65) Prior Publication Data
US 2018/0354242 A1 Dec. 13, 2018

(30) Foreign Application Priority Data
Nov. 25, 2015 (JP) .................................. 2015-230010

(51) Int. Cl.
| | | |
|---|---|---|
| B32B 27/20 | (2006.01) | |
| B32B 27/18 | (2006.01) | |
| B32B 27/30 | (2006.01) | |
| C09D 7/61 | (2018.01) | |
| C09D 7/40 | (2018.01) | |
| C09D 5/32 | (2006.01) | |
| C09D 175/16 | (2006.01) | |
| H05K 9/00 | (2006.01) | |
| C08F 299/06 | (2006.01) | |
| B32B 7/12 | (2006.01) | |
| B32B 15/082 | (2006.01) | |
| B32B 15/20 | (2006.01) | |
| C09D 5/24 | (2006.01) | |
| C09D 175/14 | (2006.01) | |
| C08K 3/22 | (2006.01) | |

(52) U.S. Cl.
CPC ............... *B32B 27/20* (2013.01); *B32B 7/12* (2013.01); *B32B 15/082* (2013.01); *B32B 15/20* (2013.01); *B32B 27/18* (2013.01); *B32B 27/30* (2013.01); *C08F 299/065* (2013.01); *C09D 5/24* (2013.01); *C09D 5/32* (2013.01); *C09D 7/61* (2018.01); *C09D 7/70* (2018.01); *C09D 175/14* (2013.01); *C09D 175/16* (2013.01); *H05K 9/0081* (2013.01); *H05K 9/0084* (2013.01); *B32B 2307/40* (2013.01); *C08K 2003/2227* (2013.01); *C08K 2003/2241* (2013.01); *C08K 2201/001* (2013.01); *C08K 2201/016* (2013.01)

(58) Field of Classification Search
CPC .... C80K 2003/2227; C80K 2003/2241; C08K 2201/001; C08K 2201/016; B32B 27/20; B32B 27/30
See application file for complete search history.

(56) References Cited

U.S. PATENT DOCUMENTS

| | | | | |
|---|---|---|---|---|
| 5,420,179 A | * | 5/1995 | Fourquier | ......... C08F 299/0478 523/523 |
| 6,048,919 A | * | 4/2000 | McCullough | ............ C08K 7/00 524/404 |
| 6,251,978 B1 | | 6/2001 | McCullough | |
| 6,827,470 B2 | * | 12/2004 | Sagal | ...................... F21S 45/47 362/341 |
| 2016/0279900 A1 | | 9/2016 | Fujiwara et al. | |

FOREIGN PATENT DOCUMENTS

| | | |
|---|---|---|
| CN | 1333801 A | 1/2002 |
| JP | S58-201398 A | 11/1983 |
| JP | 2000-114767 A | 4/2000 |
| JP | 2001-028494 A | 1/2001 |
| JP | 2002-185177 A | 6/2002 |
| WO | 2015072487 A1 | 5/2015 |

OTHER PUBLICATIONS

International Preliminary Report on Patentability of PCT/JP2016/084631 dated May 29, 2018.
Office Action of the corresponding CN application No. 201680064398.2 dated Apr. 28, 2019 and English translation thereof.

* cited by examiner

*Primary Examiner* — Margaret G Moore
(74) *Attorney, Agent, or Firm* — Muncy, Geissler, Olds & Lowe, P.C.

(57) ABSTRACT

A sheet-shaped matched-type electromagnetic wave absorber can obtain electromagnetic wave absorption performance with a relatively small thickness but has a problem that particularly a dimensional change in an electromagnetic wave absorption layer (resin composition layer) has a large influence on the electromagnetic wave absorption performance when being exposed to a high temperature. By laminating a resin composition layer in which a filler with an aspect ratio of 5 or more and a filler with an aspect ratio of less than 5 are dispersed and fixed with an electromagnetic wave reflection layer in a cured product of a resin composition containing an acrylic polymerizable resin and a polymerization initiator, it is possible to provide a matched-type electromagnetic wave absorber having high heat resistant dimensional stability and high electromagnetic wave absorption performance.

18 Claims, 2 Drawing Sheets

MATCHED-TYPE ELECTROMAGNETIC WAVE ABSORBER

TECHNICAL FIELD

The present invention relates to a matched-type electromagnetic wave absorber, particularly to a matched-type electromagnetic wave absorber for preventing electromagnetic wave interference in a GHz band.

BACKGROUND ART

In recent years, use of an electromagnetic wave in a microwave to millimeter wave band (GHz band) has progressed rapidly, and is about to be widely used for an automobile collision prevention radar, an automatic drive control radar, or the like. In order for such a system to operate normally, it is necessary to efficiently suppress emission of an unnecessary electromagnetic wave to an outside and entrance thereof from the outside, and a thin electromagnetic wave absorber having long-term heat resistant stability that makes on-vehicle use possible and capable of being disposed also in a narrow spot has been required.

In an electromagnetic wave absorber having such an object, as an absorber that absorbs only a specific frequency, a so-called matched-type electromagnetic wave absorber in which an electromagnetic wave absorption layer having a predetermined complex relative dielectric constant with a predetermined thickness according to a target frequency and an electromagnetic wave reflection layer on one side thereof are formed is known. In addition, an electromagnetic wave absorber that absorbs an electromagnetic wave over a relatively wide frequency band using a soft magnetic powder or the like is known.

The matched-type electromagnetic wave absorber is generally designed by controlling an amplitude and a phase of an electromagnetic wave such that an electromagnetic wave reflected on a surface of the electromagnetic wave absorption layer and an electromagnetic wave reflected on and returned from an interface between the electromagnetic wave reflection layer on a back side and the electromagnetic wave absorption layer cancel out each other. In a case where an electromagnetic wave is vertically incident, and no reflection occurs, it is known that a relationship between a real part and an imaginary part of a complex relative dielectric constant of the electromagnetic wave absorption layer changes according to $d/\lambda$ (d: thickness of electromagnetic wave absorption layer, $\lambda$: wavelength of electromagnetic wave). This relationship can be expressed by a non-reflection curve illustrated in FIG. 1.

Even when either of the electromagnetic wave absorbers is used, dimensional stability of the electromagnetic wave absorber is an important factor determining a peak absorption frequency. As an attempt to improve the dimensional stability of an electromagnetic wave absorption layer of the electromagnetic wave absorber using a soft magnetic powder or the like, for example, it has been proposed to add a heat-resistant stabilizer or a heat aging inhibitor to the electromagnetic wave absorber (for example, Patent Literature 1).

In addition, an electromagnetic wave absorber specifying a total addition % by volume of a flame retardant and a soft magnetic metal powder has also been proposed (for example, Patent Literature 2).

Furthermore, a proposal has been made to suppress a dimensional change by subjecting an electromagnetic wave absorber specifying a total % by volume of a soft magnetic powder and a non-magnetic powder to an aging treatment (for example, Patent Literature 3).

CITATION LIST

Patent Literature

Patent Literature 1: JP 2000-114767 A
Patent Literature 2: JP 2001-28494 A
Patent Literature 3: JP 2002-185177 A

SUMMARY OF INVENTION

Technical Problem

However, each of the electromagnetic wave absorbers of Patent Literatures 1 to 3 uses a soft magnetic powder or the like, has a larger thickness than the matched-type electromagnetic wave absorber, and is not suitable for disposition of the electromagnetic wave absorber in a highly integrated electronic circuit or a narrow spot. In addition, with an increase in the amount of information to be exchanged, the above highly integrated electronic circuit is more likely to generate heat than a conventional electronic circuit, and an electromagnetic wave absorber used for such an application requires higher temperature resistance (dimensional stability) than a conventional electromagnetic wave absorber. A matched-type electromagnetic wave absorber that absorbs an electromagnetic wave using an amplitude and a phase has an advantage of being able to design the electromagnetic wave absorber so as to have a small thickness. Meanwhile, a dimensional change of the electromagnetic wave absorber has a large influence on electromagnetic wave absorption performance. The electromagnetic wave absorber tends to require higher heat resistant dimensional stability.

Therefore, an object of the present invention is to provide a matched-type electromagnetic wave absorber capable of maintaining heat resistant dimensional stability over a long period of time even when the electromagnetic wave absorber is exposed to a high temperature and efficiently absorbing an electromagnetic wave in a GHz band even with a small thickness that can be used also for a narrow spot.

Solution to Problem

As a result of intensive studies, the present inventors have found that by laminating a resin composition layer in which a filler with an aspect ratio of 5 or more and a filler with an aspect ratio of less than 5 are dispersed and fixed with an electromagnetic wave reflection layer in a cured product of a resin composition containing an acrylic polymerizable resin and a polymerization initiator, it is possible to obtain a matched-type electromagnetic wave absorber having high dimensional stability even when the electromagnetic wave absorber is exposed to a high temperature and capable of efficiently absorbing an electromagnetic wave in a GHz band even with a small thickness, and have reached the present invention.

That is, the present invention (1) is a matched-type electromagnetic wave absorber comprising a laminated structure including at least a resin composition layer and an electromagnetic wave reflection layer, in which, in the resin composition layer, a component (C): filler with an aspect ratio of 5 or more and a component (D): filler with an aspect ratio of less than 5 are dispersed and fixed in a cured product of a resin composition containing a component (A): acrylic polymerizable resin and a component (B): polymerization initiator.

The present invention (2) is the matched-type electromagnetic wave absorber according to the invention (1), in which a volume ratio represented by [the component (C)+the component (D)]/resin composition layer is 0.1 to 0.5.

The present invention (3) is the matched-type electromagnetic wave absorber according to the invention (1) or (2), in which the component (C): filler with an aspect ratio of 5 or more is a conductive filler and the component (D): filler with an aspect ratio of less than 5 is aluminum hydroxide and/or magnesium hydroxide.

The present invention (4) is the matched-type electromagnetic wave absorber according to the invention (3), in which the conductive filler is conductive titanium oxide and has an average length of 0.5 to 50 μm.

The present invention (5) is the matched-type electromagnetic wave absorber according to any one of the inventions (1) to (4), in which the component (A): acrylic polymerizable resin contains any one or more selected from an epoxy acrylate, a urethane acrylate, an ester acrylate, a copolymerized acrylate, a butadiene acrylate, a silicone acrylate, and an amino resin acrylate each having a vinyl group.

The present invention (6) is the matched-type electromagnetic wave absorber according to any one of the inventions (1) to (5), in which the component (B): polymerization initiator is an organic peroxide.

Advantageous Effects of Invention

The present invention can provide a thin matched-type electromagnetic wave absorber having high dimensional stability even when being exposed to a high temperature for a long period of time and capable of efficiently absorbing an electromagnetic wave in a GHz band.

The thin electromagnetic wave absorber has a large change ratio with respect to the total thickness even with a small dimensional change and has a risk that a peak absorption frequency largely fluctuates particularly in a GHz band having a high frequency. The dimensional change of the matched-type electromagnetic wave absorber largely depends on a dimensional change of the resin composition layer (electromagnetic wave absorption layer). It is presumed that the present invention can suppress expansion or shrinkage of a curing component in a resin composition layer of a matched-type electromagnetic wave absorber due to a high temperature by dispersing a filler with an aspect ratio of 5 or more in the resin composition layer like an aggregate and disposing a filler with an aspect ratio of less than 5 in the resin composition layer like a spacer.

DESCRIPTION OF EMBODIMENTS

Hereinafter, an electromagnetic wave absorber of the present invention will be described in detail.

«Matched-Type Electromagnetic Wave Absorber»

Figure 1:
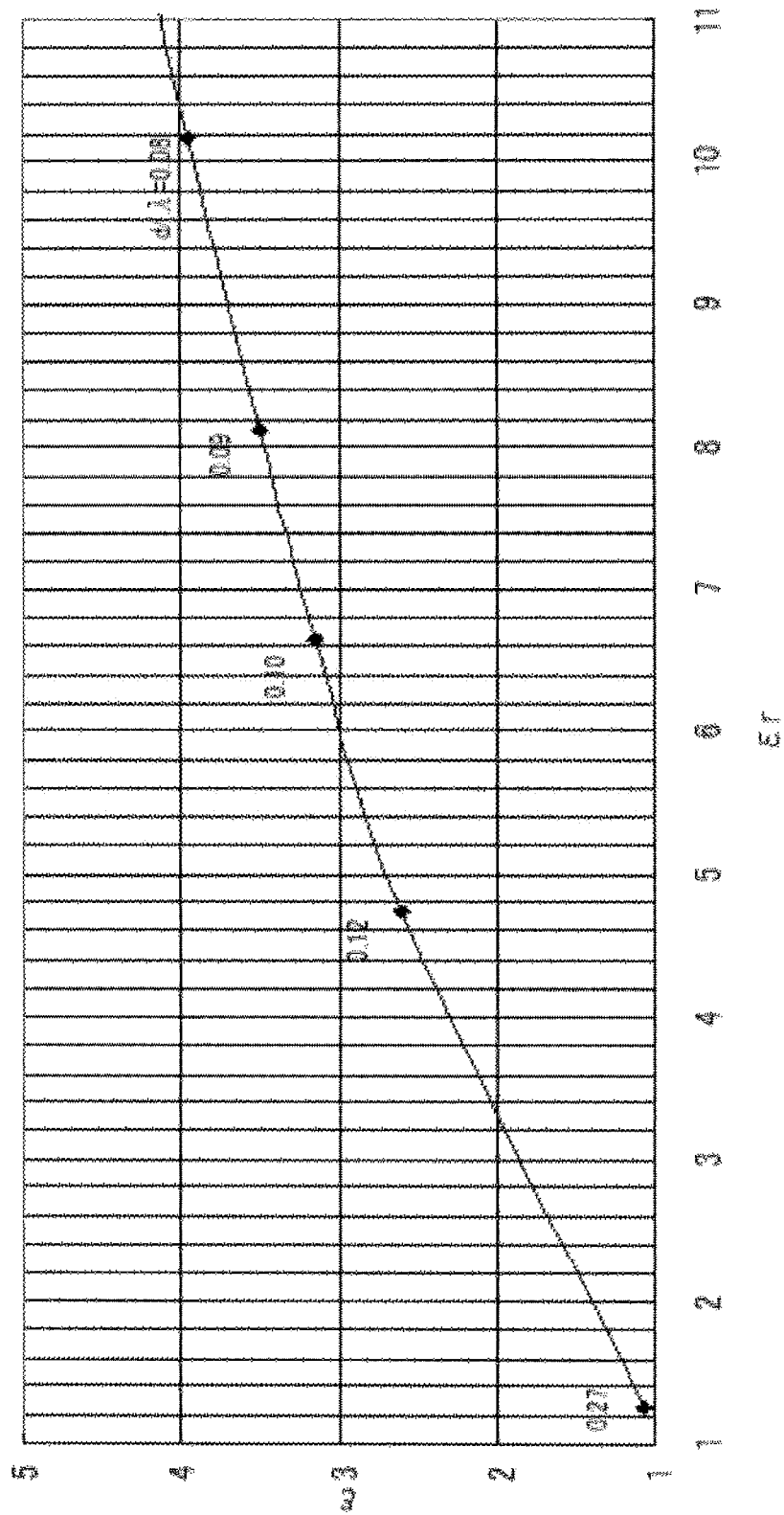
FIG. 1 is a graph illustrating a non-reflection curve.
Figure 2:
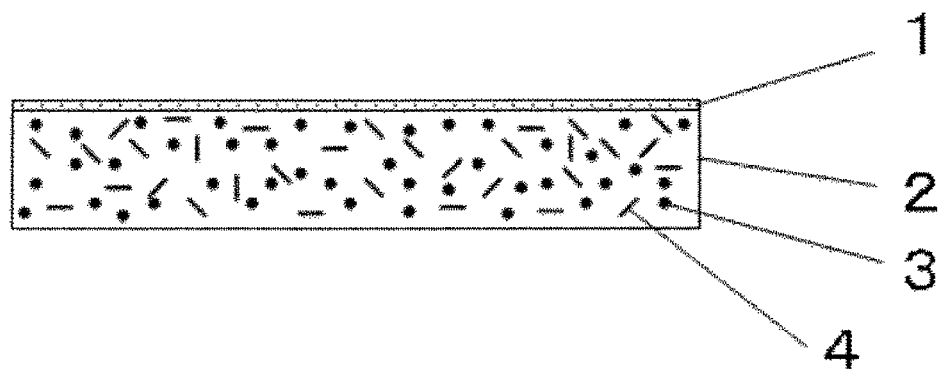
FIG. 2 is a schematic view illustrating a cross section of an electromagnetic wave absorber having no adhesive layer of the present invention.
Figure 3:
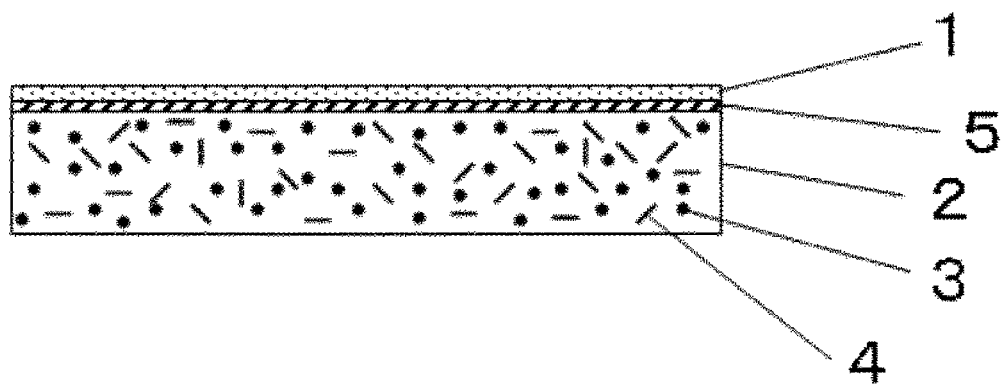
FIG. 3 is a schematic view illustrating a cross section of an electromagnetic wave absorber having an adhesive layer of the present invention.

In the matched-type electromagnetic wave absorber of the present invention, a resin composition layer (electromagnetic wave absorption layer) having a predetermined complex relative dielectric constant is formed on one side of an electromagnetic wave reflection layer such as an aluminum foil so as to have a predetermined thickness according to a target frequency. The matched-type electromagnetic wave absorber is designed by controlling an amplitude and a phase of an electromagnetic wave such that an electromagnetic wave reflected on a surface of the resin composition layer and an electromagnetic wave reflected on and returned from an interface between the electromagnetic wave reflection layer and the resin composition layer laminated cancel out each other. In a case where an electromagnetic wave is vertically incident and no reflection occurs, a relationship between a real part (Er) and an imaginary part (εi) of a complex relative dielectric constant of the resin composition layer (electromagnetic wave absorption layer) changes according to d/λ (d: thickness of resin composition layer, λ: wavelength of electromagnetic wave), and is represented by a non-reflection curve illustrated in FIG. 1. As illustrated in FIG. 2, the matched-type electromagnetic wave absorber of the present invention may be obtained by directly laminating an electromagnetic wave reflection layer and a resin composition layer, or as illustrated in FIG. 3, may be obtained by laminating an electromagnetic wave reflection layer and a resin composition layer through another layer (for example, an adhesive layer) (in this case, another layer may be formed into a thin layer having no influence on thermal adhesion or electromagnetic wave absorption characteristics or the electromagnetic wave reflection layer and the resin composition layer may be designed by considering the thickness of another layer).

<Electromagnetic Wave Reflection Layer>

As the electromagnetic wave reflection layer according to the present invention, a metal plate such as aluminum, copper, iron, or stainless steel, a metal foil, a thin film of the above metals formed on a polymer film by vacuum vapor deposition, plating, or the like, a resin or the like reinforced with a woven fabric or a nonwoven fabric made of a conductive material such as the above metals or a carbon fiber, and the like can be used. In addition, a material other than the above materials can be used as long as being able to reflect an electromagnetic wave.

<Resin Composition Layer>

The resin composition layer according to the present invention has a configuration in which a component (C): filler with an aspect ratio of 5 or more and a component (D): filler with an aspect ratio of less than 5 are dispersed and fixed in a cured product of a resin composition containing a component (A): acrylic polymerizable resin and a component (B): polymerization initiator.

{Component (A)}

As the component (A): acrylic polymerizable resin, an epoxy acrylate, a urethane acrylate, an ester acrylate, a copolymerized acrylate, a butadiene acrylate, a silicone acrylate, and/or an amino resin acrylate each having a vinyl group is preferably used, and an acrylic oligomer having about 2 to 20 repeating units is more preferably used. Examples thereof include an epoxy acrylate, a urethane acrylate, a polyester acrylate, a copolymerized acrylate, a butadiene acrylate, a silicone acrylate, and an amino resin acrylate each having 2 to 6 vinyl groups at a terminal thereof. Among these resins, a tri-functional or less resin is preferable because curing shrinkage of the resin is easily suppressed. These resins can be used singly or in combination of two or more kinds thereof. Among these resins, a urethane acrylate having a weight average molecular weight of 500 to 10,000 and a viscosity of 3,000 to 500,000 mPa·s/25° C. is more preferable because of easy application in a solvent-free system. By not using a solvent for forming a resin composition layer, a dimensional change of the resin composition layer due to volatilization of a residual solvent is easily suppressed. Note that the weight average molecular weight is a value measured using gel permeation chromatography (manufactured by JASCO Corporation) according to JIS K7252, and the viscosity is a value measured using an E type viscometer.

{Component (B)}

As the component (B): polymerization initiator according to the present invention, a known compound can be used, but an organic peroxide is preferable. The organic peroxide is suitable because a temperature at which an acrylic resin composition is polymerized and cured without a solvent can be freely set in a temperature range of normal temperature to about 300° C. Examples of the organic peroxide include methyl ethyl ketone peroxide, cyclohexane peroxide, 3,3,5-trimethylcyclohexanone peroxide, methylcyclohexanone peroxide, methyl acetoacetate peroxide, acetylacetone peroxide, 1,1-bis (t-butylperoxy)-3,3,5 trimethylhexane, 1,1-bis (t-butylperoxy)-cyclohexane, 2,2-bis (t-butylperoxy) octane, n-butyl-4,4-bis (t-butylperoxy) valate, 2,2-bis (t-butylperoxy) butane, t-butyl hydroperoxide, cumene hydroperoxide, di-isopropylbenzene hydroperoxide, p-menthane hydroperoxide, 2,5-dimethylhexane-2,5-dihydroperoxide, 1,1,3,3-tetramethylbutyl hydroperoxide, 1,1,3,3-tetramethylbutylperoxy-2-ethylhexanate, di-t-butylperoxide, t-butylcumylperoxide, di-cumylperoxide, α,α'-bis (t-butylperoxy-m-isopropyl) benzene, 2,5-dimethyl-2,5-di (t-butylperoxy) hexane, 2,5-dimethyl-2,5-di (t-butylperoxy) hexyne, acetyl peroxide, isobutyl peroxide, octanoyl peroxide, decanoyl peroxide, benzoyl peroxide, lauroyl peroxide, dilauroyl peroxide, 3,5,5-trimethylhexanoyl peroxide, succinic acid peroxide, 2,4-dichlorobenzoyl peroxide, m-toluoyl peroxide, di-isopropyl peroxydicarbonate, di-2-ethylhexyl peroxydicarbonate, di-n-propyl peroxydicarbonate, bis-(4-t-butylcyclohexyl) peroxydicarbonate, di-myristyl peroxydicarbonate, di-2-ethoxyethyl peroxydicarbonate, di-methoxyisopropyl peroxydicarbonate, di (3-methyl-3-methoxybutyl) peroxydicarbonate, di-allyl peroxydicarbonate, t-butylperoxyacetate, t-butylperoxyisobutyrate, t-butyl peroxypivalate, t-butyl peroxyneodecanoate, cumyl peroxyneodecanoate, t-butyl peroxy-2-ethyl hexanoate, t-butylperoxy-3,5,5-trimethyl hexanoate, t-butylperoxylaurate, t-butylperoxybenzoate, di-t-butylperoxyisophthalate, 2,5-dimethyl-2,5-di (benzoylperoxy) hexane, t-butylperoxymaleic acid, t-butylperoxyisopropylcarbonate, cumylperoxyoctate, t-hexylperoxyneodecanoate, t-hexyl peroxypivalate, t-butyl peroxyneohexanate, acetyl cyclohexyl sulfonyl peroxide, t-butylperoxy allyl carbonate, and the like. These compounds can be used singly or in combination of two or more kinds thereof.

{Ratio of Component (A)/Component (B)}

Furthermore, a mass ratio represented by component (A)/component (B) in a resin composition including the components (A) and (B) is preferably 10 to 2,000, more preferably 20 to 1,000, and still more preferably 33 to 200. At a mass ratio of more than 2,000, a curing reaction is insufficient, and shrinkage occurs in the resin composition layer due to weight reduction of a residual uncured component in a high temperature state over a long period of time, and electromagnetic wave absorption performance may deviate from a desired frequency band. At a mass ratio of less than 10, a curing shrinkage ratio of the resin composition layer is large, and it may be difficult to control a layer thickness when an electromagnetic wave absorber is manufactured.

{Content of [Component (A)+Component (B)] in Resin Composition}

The content of [component (A)+component (B)] in the resin composition for obtaining the most ideal electromagnetic wave absorption performance is arbitrarily determined according to a frequency of an electromagnetic wave to be absorbed and a complex relative dielectric constant corresponding thereto.

{Component (C)}

A filler as the component (C) according to the present invention has an aspect ratio of 5 or more, preferably of 12 or more. There is no particular upper limit on the aspect ratio, but it may be set the aspect ratio to a value preventing the aspect ratio from becoming too large to disturb smoothness of a surface of the resin composition layer (for example, the aspect ratio is 1000 or less). Examples of the filler with an aspect ratio of 5 or more include an inorganic fiber such as a titanium oxide fiber, a glass fiber, rock wool, a carbon fiber, an alumina fiber, wollastonite, or a potassium titanate fiber, and an organic fiber including a natural fiber such as cotton, hemp, or silk, and a synthetic fiber such as aramid, polyamide, polyester, polyethylene, an acrylic fiber, or rayon. In addition to these compounds, any compound can be used as long as exhibiting an aggregate function in the resin composition layer and being able to contribute to suppression of expansion or shrinkage of the resin composition layer. However, a conductive filler is preferable. It is presumed that the filler remarkably exhibits a so-called aggregate function of preventing expansion, shrinkage, or the like of the resin composition layer by setting the aspect ratio of the component (C) to 5 or more, and as a result, the filler can contribute to dimensional stability of the resin composition layer.

These compounds can be used singly or in combination of two or more kinds thereof. Among these compounds, conductive acicular titanium oxide (conductive titanium oxide with an aspect ratio of 5 or more) is preferably included because the real part of the complex relative dielectric constant is easily designed. Acicular titanium oxide is obtained by repeating, in the presence of a titanium dioxide nuclear crystal having an axial ratio of 2 or more, a step of growing the titanium dioxide nucleus crystal by heating and sintering a titanium compound, an alkali metal compound, and an oxylin compound twice or more, for example. Conductive acicular titanium oxide is obtained by adding a solution containing a tin compound and a solution containing a compound such as antimony or phosphorus to a suspension in which the obtained acicular titanium oxide is suspended, precipitating the obtained solution, and then heating and sintering the obtained product, for example. An average diameter of the conductive acicular titanium oxide and an average length thereof are preferably 0.05 to 5.0 μm and 0.5 to 50 μm, and more preferably 0.15 to 0.5 μm and 2 to 10 μm, respectively. Here, the values of "average diameter", "average length" and "aspect ratio" are obtained by performing SEM observation of the component (C), observing and measuring at least 100 particles, and calculating an average value thereof. More specifically, the "average diameter" means an average value of area diameters obtained by calculating a cross-sectional area of a particle (for example, using a known software) based on a vertical cross section near the center of a particle imaged by SEM observation in a longitudinal direction and calculating the diameter of a circle having the same area as the cross-sectional area. Each of the average diameter and the average length is an average value of measured values of 100 particles, and the aspect ratio is a value obtained from a ratio between the average diameter and the average length. When the aspect ratio of the component (C) is less than 5, it is difficult to obtain an effect as an aggregate, and it tends to be difficult to make a complex relative dielectric constant reach a non-reflection curve.

The conductive acicular titanium oxide may be subjected to a surface treatment in combination with an inorganic compound, an organic compound, or an inorganic compound and an organic compound. In a case where an inorganic compound and an organic compound are used in combination, if an outermost portion is coated with the organic compound, dispersion in the resin composition layer tends to be easy, compatibility with the component (A) and/or the component (B) is good, and a function as an aggregate is easily exhibited. Therefore, this case is preferable. Examples of the inorganic compound include oxides and hydrated oxides of silicon, zirconium, aluminum, and titanium. These compounds may be used singly, in lamination of two or more kinds thereof, or in mixture of two or more kinds thereof. Examples of the organic compound include an organosilicon compound, an organometallic compound, polyols, alkanolamines or derivatives thereof, higher fatty acids or metal salts thereof, and higher hydrocarbons or derivatives thereof. The organic compounds may be used singly, in lamination of two or more kinds thereof, or in mixture of two or more kinds thereof.

Examples of the organosilicon compound include a straight polysiloxane (dimethyl polysiloxane, methylhydrogen polysiloxane, methylmethoxy polysiloxane, methylphenyl polysiloxane, or the like), a modified polysiloxane (dimethyl polysiloxane diol, dimethyl polysiloxane dihydrogen, side chain or both terminal amino-modified polysiloxane, side chain, both terminal, or one terminal epoxy-modified polysiloxane, both terminal or one terminal methacrylic-modified polysiloxane, side chain or both terminal carboxyl-modified polysiloxane, side chain, both terminal, or one terminal carbinol-modified polysiloxane, both terminal phenol-modified polysiloxane, side chain or both terminal mercapto-modified polysiloxane, both terminal or side chain polyether-modified polysiloxane, side chain alkyl-modified polysiloxane, side chain methylstyryl-modified polysiloxane, side chain carboxylic acid ester-modified polysiloxane, side chain fluoroalkyl-modified polysiloxane, side chain alkyl/carbinol-modified polysiloxane, side chain amino/both terminal carbinol-modified polysiloxane, or the like) or copolymers thereof, an aminosilane (aminopropyltriethoxysilane, N-β (aminoethyl) γ-aminopropyltriethoxysilane, or N-phenyl-γ-aminopropyltrimethoxysilane), an epoxysilane (γ-glycidoxypropyltrimethoxysilane, β-(3,4-epoxycyclohexyl) ethyltrimethoxysilane, or the like), a methacrylsilane (methacryloxypropyl trimethoxysilane or the like), a vinylsilane (vinyltriethoxysilane or the like), a mercaptosilane (3-mercaptopropyl trimethoxysilane or the like), a chloroalkylsilane (3-chloropropyltriethoxysilane or the like), an alkylsilane (n-butyltriethoxysilane, isobutyltrimethoxysilane, n-hexyltrimethoxysilane, n-hexyltriethoxysilane, cyclohexylmethyldiethoxysilane, n-octyltrimethoxysilane, n-octyltriethoxysilane, n-decyltrimethoxysilane, n-hexadecyltriethoxysilane, n-octadecyltrimethoxysilane, n-octadecylmethyldimethoxysilane, or the like), a phenylsilane (phenyltriethoxysilane or the like), a fluoroalkylsilane (trifluoropropyltrimethoxysilane or tridecafluorooctyltrimethoxysilane) or hydrolysis products thereof, and (3) an organosilazane (hexamethylsilazane or hexamethylcyclotrisilazane).

Examples of the organometallic compound include an aminoalkoxytitanium (isopropyltri (N-aminoethyl-aminoethyl) titanate or the like), a phosphic acid ester titanium (isopropyltris (dioctylpyrophosphate) titanate, bis (dioctylpyrophosphate) oxyacetate titanate, bis (dioctylpyrophosphate) ethylene titanate, or the like), a carboxylic acid ester titanium (isopropyl triisostearoyl titanate or the like), a sulfonic acid ester titanium (isopropyl-n-dodecylbenzenesulfonyl titanate or the like), a titanium chelate (titanium diisopropoxy bisacetylacetonate, titanium diisopropoxybisethyl acetoacetate, octylene glycol titanate, or the like), and so on), a phosphite ester titanium complex (tetraoctylbis (ditridecylphosphite) titanate, tetra (2,2-diallyloxymethyl-1-butyl) bis (ditridecyl) phosphite titanate, tetraisopropylbis (dioctylphosphite) titanate, or the like), a carboxylic acid ester zirconium (zirconium tributoxy stearate or the like), a zirconium chelate (zirconium tributoxy acetylacetonate or the like), and so on), and (3) an organoaluminum compound (an aluminum chelate (aluminum acetylacetonate diisopropylate, aluminum ethylacetoacetate diisopropylate, aluminum bisethyl acetoacetate monoacetylacetonate, octadecylene acetoacetate aluminum diisopropylate, or the like) and so on.

Examples of the polyols include trimethylolpropane, trimethylolethane, pentaerythritol, and the like.

Examples of the alkanolamines include monoethanolamine, diethanolamine, triethanolamine, monopropanolamine, dipropanolamine, tripropanolamine, and the like. Examples of derivatives thereof include organic acid salts thereof such as acetates, oxalates, tartrates, formates, benzoates, and the like.

Examples of the higher fatty acids include stearic acid, lauric acid, oleic acid, and the like. Examples of metal salts thereof include aluminum salts, zinc salts, magnesium salts, calcium salts, barium salts thereof, and the like.

Examples of the higher hydrocarbons include a paraffin wax, a polyethylene wax, and the like. Examples of derivatives thereof include perfluorinated compounds thereof and the like.

A method for coating surfaces of titanium oxide particles with an inorganic compound or an organic compound can be any known method regardless of whether the method is a dry type method or a wet type method.

{Component (D)}

A filler as the component (D) according to the present invention has an aspect ratio of less than 5, preferably of 2 or less. The filler with an aspect ratio of less than 5 is preferably an inorganic powder such as an oxide, a hydroxide, a carbonate, a sulfate, or a silicate. These compounds can be used singly or in combination of two or more kinds thereof. Among these compounds, a hydroxide, particularly aluminum hydroxide and magnesium hydroxide are preferable because flame retardancy can be imparted. Note that the component (D) is a material different from the component (C) {for example, in a case where the component (C) is conductive titanium oxide, the component (D) is another material than the conductive titanium oxide}. The component (D) has an average particle diameter preferably of 0.01 to 10 μm, more preferably of 0.05 to 5 μm. If the average particle diameter is less than 0.01 μm, uniform dispersibility in the resin composition layer may be deteriorated. If the average particle diameter is more than 10 μm, a spacer effect tends to decrease probably because it is difficult to enter a molecular chain of the resin composition layer. By using such a filler not significantly having a long axis and a short axis, it is presumed that a filler easily exists as a spacer particularly in a molecular chain of the component (A) and a dimensional change is easily suppressed even in a case where the resin composition layer is exposed to heat. Here, the values of "average diameter", "average length" and "aspect ratio" of the component (D) are obtained by performing SEM observation of the component (D), observing and measuring at least 100 particles, and calculating an average value thereof. That is, each of the average diameter and the average length is an average value of measured values of 100 particles, and the aspect ratio is a value obtained by measuring the lengths of long axes and short axes of 100 particles and calculating a ratio between an average value of the lengths of long axes and an average value of the lengths of short axes. The average particle diameter means a circle-equivalent diameter of a projected area average similarly obtained by performing SEM observation of the component (D) and observing and measuring at least 100 particles.

{[Component (C)+Component (D)]/Resin Composition Layer}

A volume ratio represented by [component (C)+component (D)]/resin composition layer is preferably 0.1 to 0.5, and more preferably 0.1 to 0.25. If the volume ratio is smaller than 0.1, it is presumed that an aggregate effect of the component (C) and a spacer effect of the component (D) are not exhibited, and a dimensional change of the resin composition layer may occur. If the volume ratio is larger than 0.5, the aggregate effect and the spacer effect are exhibited, but flexibility of the cured resin composition layer decreases, and it may be difficult to cope with a narrow spot or a complicated shape.

{Volume Ratios of Component (C) and Component (D)}

Volume ratios of the components (C) and (D) may be determined depending on a frequency band to be absorbed. Particularly, the component (C) plays an important role in determining an absorption frequency band. It is necessary to include both the components (C) and (D) in view of an influence of the resin composition layer on dimensional stability. However, the volume ratios thereof can be arbitrarily set. That is, a case where the component (C) is rich makes the aggregate effect dominant, and a case where the component (D) is rich makes the spacer effect dominant. In both cases, it is presumed that this makes it possible to achieve the object of the present invention.

{Other Components}

The resin composition may contain, as necessary, an optional component such as a flame retardant, a flame retardant aid, a filler, a release agent, a surface treatment agent, a viscosity modifier, a plasticizer, an antibacterial agent, an antifungal agent, a leveling agent, an antifoaming agent, a colorant, a stabilizer, a coupling agent, a dispersant, a lubricant, an antioxidant, an ultraviolet absorber, a light stabilizer, an antistatic agent, a reactive diluent, or the like (hereinafter, generally referred to as an optional component of the matched-type electromagnetic wave absorber) within a range not impairing an electromagnetic wave absorption effect.

Among these components, the reactive diluent component has an alkyl group having 1 to 12 carbon atoms, and examples thereof include methyl (meth)acrylate, ethyl (meth)acrylate, n-propyl (meth)acrylate, isopropyl (meth)acrylate, n-butyl (meth)acrylate, isobutyl (meth)acrylate, pentyl (meth)acrylate, cyclohexyl (meth)acrylate, 2-ethylhexyl (meth)acrylate, n-octyl (meth)acrylate, isooctyl (meth)acrylate, lauryl (meth)acrylate, N-vinylformamide, and the like. These compounds can be used singly or in combination of two or more kinds thereof. By allowing these substances to function as a reactive diluent, even a coating material containing a relatively large amount of filler such as the component (C) or (D) has a smooth surface, good dispersibility of a filler component, and easily forms a resin composition layer to exhibit the aggregate effect of the component (C) and the spacer effect of the component (D) advantageously. In addition, due to reactivity, after coating, these substances react with the components (A) and (B), and an effect of having no adverse influence on a dimensional change of the resin composition layer can be expected. The content of an optional resin component in a resin composition containing these reactive diluents is preferably 50% by mass or less, and more preferably 25% by mass or less with respect to the component (A).

«Manufacture of Matched-Type Electromagnetic Wave Absorber»

The matched-type electromagnetic wave absorber of the present invention can be obtained by directly applying a coating material (resin composition) onto the electromagnetic wave reflection layer, or by a method for curing a resin composition applied onto a PET film or the like and then bonding the resin composition to the electromagnetic wave reflection layer through an adhesive layer or the like, for example.

In a case where the resin composition layer is bonded to the electromagnetic wave absorption layer with an adhesive or the like, an absorption frequency may be designed by considering the thickness of the adhesive layer.

For example, a method for manufacturing the matched-type electromagnetic wave absorber of the present invention includes a coating material preparing step of obtaining a coating material in which a filler containing the components (C) and (D) is dispersed in the resin composition containing the components (A) and (B), and a layer forming step of applying a coating material so as to have a desired thickness and then curing the coating material to obtain a sheet material.

In the coating material preparing step, a conventionally known method can be used, and examples thereof include a method for adding, as necessary, an optional component to the resin composition containing the components (A) and (B), adding the components (C) and (D), and stirring the resin composition.

The layer forming step of the resin composition layer may be performed by using a conventionally known forming method, and examples thereof include a method for applying a coating material onto a sheet serving as an electromagnetic wave reflection layer at an arbitrary thickness, then laminating a releasable protective film thereon, and curing the resulting product. Examples of an application method include a method using a bar coater, a comma coater, a die coater, or the like, but are not limited thereto. In addition to these methods, it is possible to use a method for bonding an electromagnetic wave reflection layer to a resin composition layer through a thin adhesive layer having no influence on thermal adhesion or electromagnetic wave absorption characteristics, or through an adhesive layer based on a design by considering the thickness of the adhesive layer, for example.

Examples of the releasable protective film include a polypropylene film, a fluorocarbon resin-based film, a polyethylene film, a polyethylene terephthalate (PET) film, paper, films obtained by subjecting these to a release treatment with a silicone resin (release-treated film), and the like.

The thickness of the releasable protective film is not particularly limited, but is preferably 1 to 200 μm, and more preferably 10 to 50 μm.

The releasable protective film preferably has a peel strength of 1.0 to 50 g/cm. If the peel strength is 1.0 g/cm or less, the releasable protective film is easily peeled off from the resin composition during curing, and a surface of the resin composition layer easily becomes non-uniform. If the peel strength is 50 g/cm or more, chipping or the like may occur when the releasable protective film is peeled off from the resin composition layer.

A method for curing the resin composition is not particularly limited as long as being able to cure the resin composition in the sheet in which the resin composition and the releasable protective film are sequentially laminated on the electromagnetic wave reflection layer for example, and examples thereof include a method for heating the laminated sheet at an arbitrary temperature. A heating temperature during curing may be arbitrarily determined in consideration of the types of the components (A) and (B) and the like.

EXAMPLES

Next, the present invention will be described in more detail by way of Examples and Comparative Examples, but the present invention is not limited to these specific examples at all.

Example 1

100 parts by mass of component (A): polyurethane acrylate having a weight average molecular weight of 2,500 and a viscosity of 6,500 mPa·s/25° C. (trade name: "Beamset 505A-6", manufactured by Arakawa Chemical Industries, Ltd.), 1.0 part by mass of component (B): 1,1,3,3-tetramethylbutylperoxy-2-ethylhexanate (trade name: "PEROCTA O": manufactured by NOF CORPORATION), 22.8 parts by mass of component (C): conductive acicular titanium oxide having an average diameter of 0.5 μm and an average length of 10.0 μm (trade name: "FT-4000" manufactured by Ishihara Sangyo Kaisha, Ltd.), and 54.6 parts by mass of component (D): fine particles of aluminum hydroxide having an average particle diameter of 1.2 μm and an aspect ratio of 1.7 (trade name: BF013 manufactured by Nippon Light Metal Co., Ltd.) were added and stirred by a known method to obtain a coating material for forming a resin composition layer.

The coating material thus obtained was applied onto an aluminum foil (electromagnetic wave reflection layer) having a thickness of 12 μm to form a coating material layer. Furthermore, a release-treated surface of a release-treated PET film was bonded to the coating material layer, and the resulting product was heated at 100° C. for 10 minutes in a hot air circulation type dryer to obtain a sheet-shaped matched-type electromagnetic wave absorber of Example 1 in which the thickness of a resin composition layer was 385 μm, a real term of a complex relative dielectric constant in 76.5 GHz was 6.9, and an imaginary term thereof was 3.2. At this time, a volume ratio represented by [component (C)+component (D)]/resin composition layer was 0.25.

Example 2

A sheet-shaped matched-type electromagnetic wave absorber of Example 2 in which the thickness of a resin composition layer was 515 μm, a real term of a complex relative dielectric constant in 60 GHz was 6.3, and an imaginary term thereof was 3.1 was obtained in a similar manner to Example 1 except that the addition amount of the component (C) was changed to 18.8 parts by mass and the addition amount of the component (D) was changed to 40.0 parts by mass. At this time, a volume ratio represented by [component (C)+component (D)]/resin composition layer was 0.2.

Example 3

A sheet-shaped matched-type electromagnetic wave absorber of Example 3 in which the thickness of a resin composition layer was 370 μm, a real term of a complex relative dielectric constant in 79 GHz was 7.0, and an imaginary term thereof was 3.2 was obtained in a similar manner to Example 1 except that the addition amount of the component (C) was changed to 23.3 parts by mass and the addition amount of the component (D) was changed to 31.5 parts by mass. At this time, a volume ratio represented by [component (C)+component (D)]/resin composition layer was 0.18.

Example 4

A sheet-shaped matched-type electromagnetic wave absorber of Example 4 in which the thickness of a resin composition layer was 365 μm, a real term of a complex relative dielectric constant in 76.5 GHz was 7.6, and an imaginary term thereof was 3.4 was obtained in a similar manner to Example 1 except that the component (C) was changed to 19.2 parts by mass of conductive acicular titanium oxide having an average diameter of 0.4 μm and an average length of 5.0 μm (trade name: "FT-3000" manufactured by Ishihara Sangyo Kaisha, Ltd.). At this time, a volume ratio represented by [component (C)+component (D)]/resin composition layer was 0.24.

Example 5

A sheet-shaped matched-type electromagnetic wave absorber of Example 5 in which the thickness of a resin composition layer was 345 μm, a real term of a complex relative dielectric constant in 76.5 GHz was 8.5, and an imaginary term thereof was 3.6 was obtained in a similar manner to Example 1 except that the component (C) was changed to 23.6 parts by mass of conductive acicular titanium oxide having an average diameter of 0.15 μm and an average length of 2.0 μm (trade name: "FT-1000" manufactured by Ishihara Sangyo Kaisha, Ltd.). At this time, a volume ratio represented by [component (C)+component (D)]/resin composition layer was 0.25.

Example 6

A sheet-shaped matched-type electromagnetic wave absorber of Example 6 in which the thickness of a resin composition layer was 380 μm, a real term of a complex relative dielectric constant in 76.5 GHz was 7.0, and an imaginary term thereof was 3.2 was obtained in a similar manner to Example 1 except that the component (A) was changed to polyurethane acrylate having a weight average molecular weight of 2,600 and a viscosity of 300,000 mPa·s/25° C. (trade name: "Beamset 504H", manufactured by Arakawa Chemical Industries, Ltd.). At this time, a volume ratio represented by [component (C)+component (D)]/resin composition layer was 0.25.

Example 7

A sheet-shaped matched-type electromagnetic wave absorber of Example 7 in which the thickness of a resin composition layer was 385 μm, a real term of a complex relative dielectric constant in 76.5 GHz was 6.9, and an imaginary term thereof was 3.2 was obtained in a similar manner to Example 1 except that the component (B) was changed to dilauroyl peroxide (trade name: "PEROIL L", manufactured by NOF CORPORATION). At this time, a volume ratio represented by [(C)+(D)]/resin composition layer was 0.25.

Example 8

A sheet-shaped matched-type electromagnetic wave absorber of Example 8 in which the thickness of a resin composition layer was 385 μm, a real term of a complex relative dielectric constant in 76.5 GHz was 7.0, and an imaginary term thereof was 3.2 was obtained in a similar manner to Example 1 except that the addition amount of the component (A) was changed to 75 parts by mass, the addition amount of the component (C) was changed to 25 parts by mass, and 25 parts by mass of N-vinylformamide was added as a reactive diluent. At this time, a volume ratio represented by [component (C)+component (D)]/resin composition layer was 0.25.

Example 9

A sheet-shaped matched-type electromagnetic wave absorber of Example 9 in which the thickness of a resin composition layer was 312 μm, a real term of a complex relative dielectric constant in 76.5 GHz was 7.1, and an imaginary term thereof was 2.9 was obtained in a similar manner to Example 1 except that the addition amount of the component (D) was changed to 15.0 parts by mass. At this time, a volume ratio represented by [component (C)+component (D)]/resin composition layer was 0.12.

Example 10

A sheet-shaped matched-type electromagnetic wave absorber of Example 10 in which the thickness of a resin composition layer was 385 μm, a real term of a complex relative dielectric constant in 76.5 GHz was 6.9, and an imaginary term thereof was 3.2 was obtained in a similar manner to Example 1 except that a copper foil having a thickness of 12 μm was used as an electromagnetic wave reflection layer in place of an aluminum foil (electromagnetic wave reflection layer) having a thickness of 12 μm. At this time, a volume ratio represented by [component (C)+component (D)]/resin composition layer was 0.25.

Comparative Example 1

A sheet-shaped matched-type electromagnetic wave absorber of Comparative Example 1 in which the thickness of a resin composition layer was 385 μm, a real term of a complex relative dielectric constant in 76.5 GHz was 3.4, and an imaginary term thereof was 0.0 was obtained in a similar manner to Example 1 except that conductive acicular titanium oxide as the component (C) was not added. At this time, a volume ratio represented by [component (C)+component (D)]/resin composition layer was 0.21.

Comparative Example 2

A sheet-shaped matched-type electromagnetic wave absorber of Comparative Example 2 in which the thickness of a resin composition layer was 385 μm, a real term of a complex relative dielectric constant in 76.5 GHz was 7.0, and an imaginary term thereof was 3.2 was obtained in a similar manner to Example 1 except that the component (D) was not added. At this time, a volume ratio represented by [component (C)+component (D)]/resin composition layer was 0.06.

Comparative Example 3

A sheet-shaped matched-type electromagnetic wave absorber of Comparative Example 3 in which the thickness of a resin composition layer was 380 μm, a real term of a complex relative dielectric constant in 76.5 GHz was 7.0, and an imaginary term thereof was 3.2 was obtained in a similar manner to Example 1 except that chlorinated polyethylene (chlorinated PE) was used in place of the component (A) and the component (B) was not added. At this time, a volume ratio represented by [component (C)+component (D)]/resin composition layer was 0.25.

Comparative Example 4

A sheet-shaped matched-type electromagnetic wave absorber of Comparative Example 4 in which the thickness of a resin composition layer was 385 μm, a real term of a complex relative dielectric constant in 76.5 GHz was 3.7, and an imaginary term thereof was 0.0 was obtained in a similar manner to Example 1 except that the component (C) was changed to conductive spherical titanium oxide having an average particle diameter of 0.25 μm and an aspect ratio of 1.6 (trade name: "ET-500W" manufactured by Ishihara Sangyo Kaisha, Ltd.). At this time, a volume ratio represented by [component (C)+component (D)]/resin composition layer was 0.25.

Examples 11 to 18 and Comparative Example 5

Matched-type electromagnetic wave absorbers according to Examples 11 to 18 and Comparative Example 5 were obtained in a similar manner to Example 1 except that the components and compositions according to Table 1 were used. Incidentally, Example 11 is an example in which the content of the component (D) is 164 parts by mass {therefore a volume ratio represented by [component (C)+component (D)]/resin composition layer is 0.46}, Example 12 is an example in which the content of the component (D) is 25 parts by mass {therefore a volume ratio represented by [component (C)+component (D)]/resin composition layer is 0.16}, Example 13 is an example in which the content of the component (D) is 100 parts by mass {therefore a volume ratio represented by [component (C)+component (D)]/resin composition layer is 0.36}, Example 14 is an example in which a carbon fiber (aspect ratio=10.9) is used as the component (C), the content of the component (C) is 10 parts by mass, and the content of the component (D) is 62 parts by mass, Example 15 is an example in which the component (C) has an aspect ratio of 10.6 (diameter 0.5 μm, length 5.3 μm), Example 16 is an example in which the component (C) has an aspect ratio of 7.2 (diameter 0.5 μm, length 3.6 μm), Example 17 is an example in which the content of the component (D) is 218 parts by mass {therefore a volume ratio represented by [component (C)+component (D)]/resin composition layer is 0.53}, Example 18 is an example in which the content of the component (D) is 7 parts by mass {therefore a volume ratio represented by [component (C)+component (D)]/resin composition layer is 0.09}, and Comparative Example 5 is an example in which the component (C) has an aspect ratio of 4.2 (diameter 0.5 μm, length 2.1 μm).

Table 1 indicates the composition or the like of a resin composition layer in each of Examples and Comparative Examples. In Table 1, the values of the resin, $TiO_2$, and $Al(OH)_3$ are in terms of "parts by mass", and the aspect ratio indicates an aspect ratio of the component (C) {or an alternative component of the component (C)}.

TABLE 1

|  | Aspect ratio | Resin | TiO2 | Al(OH)3 | C + D Volume ratio |
|---|---|---|---|---|---|
| Example 1 | 20 | 101 | 22.8 | 54.6 | 0.25 |
| Example 2 | 20 | 101 | 18.8 | 40 | 0.2 |
| Example 3 | 20 | 101 | 23.3 | 31.5 | 0.18 |
| Example 4 | 12.5 | 101 | 19.2 | 54.6 | 0.24 |
| Example 5 | 13.3 | 101 | 23.6 | 54.6 | 0.25 |
| Example 6 | 20 | 101 | 22.8 | 54.6 | 0.25 |
| Example 7 | 20 | 101 | 22.8 | 54.6 | 0.25 |
| Example 8 | 20 | 101 | 25 | 54.6 | 0.25 |
| Example 9 | 20 | 101 | 22.8 | 15 | 0.12 |
| Example 10 | 20 | 101 | 22.8 | 54.6 | 0.25 |
| Comparative Example 1 | — | 101 | 0 | 54.6 | 0.21 |
| Comparative Example 2 | 20 | 101 | 22.8 | 0 | 0.06 |
| Comparative Example 3 | 20 | 101 | 22.8 | 54.6 | 0.25 |
| Comparative Example 4 | 1.6 | 101 | 22.8 | 54.6 | 0.25 |
| Example 11 | 20 | 101 | 22.8 | 164 | 0.46 |
| Example 12 | 20 | 101 | 22.8 | 25 | 0.16 |
| Example 13 | 20 | 101 | 22.8 | 100 | 0.36 |
| Example 14 | 10.9 | 101 | 10 | 62 | 0.25 |
| Example 15 | 10.6 | 101 | 22.8 | 54.6 | 0.25 |
| Example 16 | 7.2 | 101 | 22.8 | 54.6 | 0.25 |
| Example 17 | 20 | 101 | 22.8 | 218 | 0.53 |
| Example 18 | 20 | 101 | 22.8 | 7 | 0.09 |
| Comparative Example 5 | 4.2 | 101 | 22.8 | 54.6 | 0.25 |

(Evaluation)

Evaluation of a complex relative dielectric constant, a reflection attenuation amount, high temperature long-term heat resistant reliability, and flexibility was performed in a frequency band of 50 to 110 GHz for the obtained matched-type electromagnetic wave absorbers of Examples 1 to 18 and Comparative Examples 1 to 5 according to the following methods. Table 2 indicates evaluation results thereof.

(Evaluation Method)

<Complex Relative Dielectric Constant>

Each of the coating materials manufactured in Examples 1 to 18 and Comparative Examples 1 to 5 was applied onto a releasable PET substrate such that the layer thickness of a resin composition layer was that described in each of Examples and Comparative Examples, was dried and cured, and then was peeled off from the releasable PET substrate to obtain a resin composition layer for evaluation. Subsequently, each of the resin composition layers for evaluation was cut into a size of 150 mm in length×150 mm in width to prepare a test piece. For the test piece, an electromagnetic wave passing through the test piece in a frequency band of 50 to 110 GHz was measured using a "free space type S parameter measurement device" manufactured by Kanto Electronic Applied Development Co., Ltd. with a "PNA network analyzer N5225A" manufactured by Key Site Technology Co., Ltd. The complex relative dielectric constant of the resin composition layer in each of Examples and Comparative Examples was thereby calculated.

<Reflection Attenuation Amount>

Each of the sheet-shaped matched-type electromagnetic wave absorbers obtained in Examples 1 to 18 and Comparative Examples 1 to 5 was cut into a size of 150 mm in length×150 mm in width to prepare a test piece, and the reflection attenuation amount of an electromagnetic wave in a frequency band of 50 to 110 GHz was measured. For the measurement, a "free space type S parameter measurement device" manufactured by Kanto Electronic Applied Development Co., Ltd. was used, and measurement was performed with a "PNA network analyzer N5225A" manufactured by Key Site Technology Co., Ltd. In the evaluation, a case where the reflection attenuation amount was 20 dB or more at a target frequency was judged as "∘" (acceptable), and a case where the reflection attenuation amount was 20 dB or less was judged as "×" (not acceptable). If the reflection attenuation amount is 20 dB or more, a reflected electromagnetic wave with respect to an incident electromagnetic wave is 1/100 or less, and it can be judged that there is practically sufficient absorption performance.

<High Temperature Long-Term Heat Resistant Reliability>

«Dimensional Stability»

Each of the sheet-shaped matched-type electromagnetic wave absorbers obtained in Examples 1 to 18 and Comparative Examples 2, 3, and 5 was cut into a size of 100 mm in length×100 mm in width to prepare a test piece. The thicknesses of this test piece before and after a high temperature long-term heat resistant reliability acceleration test (2,000 hours at 120° C.) were measured with a micrometer. A case where a change in thickness was less than 3% was evaluated as ∘, and a case where the change was 3% or more was evaluated as ×. If the change in thickness is more than 3%, a decrease in absorption performance and a shift in absorption peak frequency tend to occur. If the change in thickness is less than 3% in the high temperature long-term heat resistant reliability acceleration test at 120° C. for 2,000 hours, sufficient long-term use resistance can be expected even for on-vehicle use, for example. Note that the matched-type electromagnetic wave absorbers of Comparative Examples 1 and 4 had the following reflection attenuation values of less than 20 dB, and therefore this test was omitted therefor.

[Evaluation Criteria]

∘: Change in thickness is less than 3%.
×: Change in thickness is 3% or more.

«Reflection Attenuation Amount»

A reflection attenuation amount after a high temperature long-term heat resistant reliability test (2,000 hours at 120° C.) was measured according to the above method for the matched-type electromagnetic wave absorbers obtained in Examples 1 to 18 and Comparative Examples 2, 3, and 5. A case where the reflection attenuation amount was 20 dB or more at a target frequency was judged as "∘" (acceptable), and a case where the reflection attenuation amount was less than 20 dB was judged as "×" (not acceptable).

«Flexibility»

Figure 4:
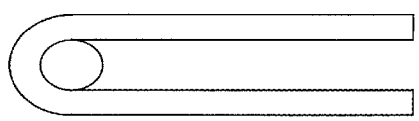
FIG. 4 is a conceptual diagram relating to a flexibility evaluation test.

Each of the sheet-shaped matched-type electromagnetic wave absorbers obtained in Examples 1 to 18 and Comparative Examples 1 to 5 was cut into a size of 200 mm in length=50 mm in width to prepare a test piece. The test piece was wound around an iron rod of 5 mm φ so as to be 180° as illustrated in FIG. 4 and evaluated.

(Evaluation Results)

As illustrated in Table 2, each of the matched-type electromagnetic wave absorbers of Examples 1 to 18 had a reflection attenuation amount of 20 dB or more ("∘") and had excellent electromagnetic wave absorption characteristics at a target frequency. In addition, each of the matched-type electromagnetic wave absorbers in Examples 1 to 18 was judged as "○" in both dimensional stability and reflection attenuation amount after the high temperature heat resistant reliability test. Even when being exposed to a high temperature for a long period of time, each of the matched-type electromagnetic wave absorbers had high dimensional stability and could efficiently absorb an electromagnetic wave in a GHz band. Meanwhile, the matched-type electromagnetic wave absorber of Comparative Example 1 containing no filler with an aspect ratio of 5 or more had a reflection attenuation amount of only 0.8 dB and could not efficiently absorb an electromagnetic wave in a target GHz band. The matched-type electromagnetic wave absorber of Comparative Example 2 containing no filler with an aspect ratio of less than 5 was judged as "○" in reflection attenuation amount, had excellent electromagnetic wave absorption characteristics at a target frequency, but was judged as "×" in both dimensional stability and reflection attenuation amount after the high temperature heat resistant reliability test. When being exposed to a high temperature, the matched-type electromagnetic wave absorber caused a dimensional change in a resin composition layer and could not efficiently absorb an electromagnetic wave in a target GHz band. Next, the matched-type electromagnetic wave absorber of Comparative Example 3 using chlorinated polyethylene as the component (A) was judged as "○" in reflection attenuation amount, had excellent electromagnetic wave absorption characteristics at a target frequency, but was judged as "×" in both dimensional stability and reflection attenuation amount after the high temperature heat resistant reliability test. When being exposed to a high temperature, the matched-type electromagnetic wave absorber caused a dimensional change in a resin composition layer and could not efficiently absorb an electromagnetic wave in a target GHz band. The matched-type electromagnetic wave absorber of Comparative Example 4 using conductive spherical titanium oxide having an aspect ratio of 1.6 as the component (C) had a reflection attenuation amount of only 0.1 dB and could not efficiently absorb an electromagnetic wave in a target GHz band.

From these results, it can be said that the matched-type electromagnetic wave absorber of the present invention has long-term high temperature heat resistant dimensional stability and excellent electromagnetic wave absorption characteristics at a target frequency.

TABLE 2

|  | Thickness | | | Dimensional stability | Point | Complex relative dielectric constant | | Reflection attenuation |
|---|---|---|---|---|---|---|---|---|
|  | Before test | After test | Change ratio |  |  | Real term | Imaginary term | Frequency |
| Example 1 | 385 | 380 | 1.3% | ○ | 3 | 6.9 | 3.2 | 76.5 |
| Example 2 | 515 | 510 | 1.0% | ○ | 3 | 6.3 | 3.1 | 60 |
| Example 3 | 370 | 365 | 1.4% | ○ | 3 | 7 | 3.2 | 79 |
| Example 4 | 365 | 359 | 1.6% | ○Δ | 2 | 7.6 | 3.4 | 76.5 |
| Example 5 | 345 | 339 | 1.7% | ○Δ | 2 | 8.5 | 3.6 | 76.5 |
| Example 6 | 380 | 375 | 1.3% | ○ | 3 | 7 | 3.2 | 76.5 |
| Example 7 | 385 | 380 | 1.3% | ○ | 3 | 6.9 | 3.2 | 76.5 |
| Example 8 | 385 | 379 | 1.6% | ○Δ | 2 | 7 | 3.2 | 76.5 |
| Example 9 | 312 | 305 | 2.2% | ○Δ | 2 | 7.1 | 2.9 | 76.5 |
| Example 10 | 385 | 380 | 1.3% | ○ | 3 | 6.9 | 3.2 | 76.5 |
| Comparative Example 1 | 385 | Not performed | — | — | 0 | 3.4 | 0 | 76.5 |
| Comparative Example 2 | 385 | 370 | 3.9% | X | 0 | 7 | 3.2 | 76.5 |
| Comparative Example 3 | 380 | 365 | 3.9% | X | 0 | 7 | 3.2 | 76.5 |
| Comparative Example 4 | 385 | Not performed | — | — | 0 | 3.7 | 0 | 76.5 |
| Example 11 | 385 | 382 | 0.8% | ○ | 3 | 7.5 | 3.1 | 76.5 |
| Example 12 | 385 | 378 | 1.8% | ○Δ | 2 | 6.8 | 3 | 76.5 |
| Example 13 | 385 | 381 | 1.0% | ○ | 3 | 7.2 | 3.2 | 76.5 |
| Example 14 | 230 | 224 | 2.6% | Δ | 1 | 27.7 | 7 | 76.5 |
| Example 15 | 385 | 379 | 1.6% | ○Δ | 2 | 6.8 | 3 | 76.5 |
| Example 16 | 385 | 378 | 1.8% | ○Δ | 2 | 6.7 | 2.8 | 76.5 |
| Example 17 | 385 | 382 | 0.8% | ○ | 3 | 7.3 | 2.9 | 76.5 |
| Example 18 | 385 | 372 | 3.4% | Δ | 1 | 6.8 | 3.1 | 76.5 |
| Comparative Example 5 | 385 | 370 | 3.9% | X | 0 | 6.7 | 2.2 | 76.5 |

Legend:
- ○ Less than 1.5% — 3 points
- ○Δ 1.5% or more and less than 2.5% — 2 points
- Δ 2.5% or more and less than 3.5% — 1 point
- X 3.5% or more — 0 point TABLE 2-continued

| | Reflection attenuation | | ○ −35 or less<br>○Δ More than 35 and −30 or less<br>Δ More than −30, and −20 or less<br>X More than −20<br>Reflection attenuation | | ○ No cracking<br>○Δ Surface cracking<br>Δ Partial cracking<br>X cracking<br>Flexibility | | 9 points ◎<br>8 points ○<br>7~6 ○Δ<br>5~4 Δ<br>3 or less NG<br>Total of<br>3 evaluations | Overall |
|---|---|---|---|---|---|---|---|---|
| | Before test | After test | | Point | 5 mm ø Wound | Point | Point | judgement |
| Example 1 | −38 | −37 | ○ | 3 | ○ | 3 | 9 | ◎ |
| Example 2 | −38 | −36 | ○ | 3 | ○ | 3 | 9 | ◎ |
| Example 3 | −37 | −35 | ○ | 3 | ○ | 3 | 9 | ◎ |
| Example 4 | −36 | −36 | ○ | 3 | ○ | 3 | 8 | ○ |
| Example 5 | −37 | −35 | ○ | 3 | ○ | 3 | 8 | ○ |
| Example 6 | −38 | −35 | ○ | 3 | ○ | 3 | 9 | ◎ |
| Example 7 | −36 | −36 | ○ | 3 | ○ | 3 | 9 | ◎ |
| Example 8 | −36 | −34 | ○Δ | 2 | ○ | 3 | 7 | ○Δ |
| Example 9 | −37 | −35 | ○ | 3 | ○ | 3 | 8 | ○ |
| Example 10 | −37 | −37 | ○ | 3 | ○ | 3 | 9 | ◎ |
| Comparative Example 1 | −0.8 | Not performed | — | 0 | ○ | 3 | 3 | NG |
| Comparative Example 2 | −36 | −12 | X | 0 | ○ | 3 | 3 | NG |
| Comparative Example 3 | −36 | −18 | X | 0 | ○ | 3 | 3 | NG |
| Comparative Example 4 | −0.1 | Not performed | — | 0 | ○ | 3 | 3 | NG |
| Example 11 | −25 | −24 | Δ | 1 | Δ | 1 | 5 | Δ |
| Example 12 | −38 | −36 | ○ | 3 | ○ | 3 | 8 | ○ |
| Example 13 | −28 | −25 | Δ | 1 | ○Δ | 2 | 6 | ○Δ |
| Example 14 | −35 | −29 | Δ | 1 | ○ | 3 | 5 | Δ |
| Example 15 | −36 | −30 | ○Δ | 2 | ○ | 3 | 7 | ○Δ |
| Example 16 | −34 | −26 | Δ | 1 | ○ | 3 | 6 | ○Δ |
| Example 17 | −26 | −24 | Δ | 1 | X | 0 | 4 | Δ |
| Example 18 | −36 | −25 | Δ | 1 | ○ | 3 | 5 | Δ |
| Comparative Example 5 | −21 | −15 | X | 0 | ○ | 3 | 3 | NG |

REFERENCE SIGNS LIST

1 Electromagnetic wave reflection layer
2 Resin composition layer
3 Filler with an aspect ratio of less than 5
4 Filler with an aspect ratio of 5 or more
5 Adhesive layer

The invention claimed is:

1. A matched-type electromagnetic wave absorber comprising:
a laminated structure including at least a resin composition layer and an electromagnetic wave reflection layer, wherein
in the resin composition layer, a component (C): filler with an aspect ratio of 5 or more and having an average length of 0.5 to 50 μm and a component (D): filler with an aspect ratio of less than 5 are dispersed and fixed in a cured product of a resin composition containing a component (A): acrylic polymerizable resin.

2. The matched-type electromagnetic wave absorber according to claim 1, wherein
a volume ratio represented by [the component (C)+the component (D)]/resin composition layer is 0.1 to 0.5.

3. The matched-type electromagnetic wave absorber according to claim 1, wherein
the component (C): filler with an aspect ratio of 5 or more is a conductive filler, and
the component (D): filler with an aspect ratio of less than 5 is aluminum hydroxide and/or magnesium hydroxide.

4. The matched-type electromagnetic wave absorber according to claim 3, wherein
the conductive filler is conductive titanium oxide.

5. The matched-type electromagnetic wave absorber according to claim 1, wherein
the component (A): acrylic polymerizable resin contains any one or more selected from an epoxy acrylate, a urethane acrylate, an ester acrylate, a copolymerized acrylate, a butadiene acrylate, a silicone acrylate, and an amino resin acrylate each having a vinyl group.

6. The matched-type electromagnetic wave absorber according to claim 1, wherein
the resin composition layer further comprises a component (B): polymerization initiator, and the component (B): polymerization initiator is an organic peroxide.

7. The matched-type electromagnetic wave absorber according to claim 1, further comprising
an adhesive layer between the electromagnetic wave reflection layer and the resin composition layer.

8. The matched-type electromagnetic wave absorber according to claim 1, wherein
the component (D) is a material different from the component (C).

9. The matched-type electromagnetic wave absorber according to claim 2, wherein
the component (C): filler with an aspect ratio of 5 or more is a conductive filler, and
the component (D): filler with an aspect ratio of less than 5 is aluminum hydroxide and/or magnesium hydroxide.

10. The matched-type electromagnetic wave absorber according to claim 2, wherein the component (A): acrylic polymerizable resin contains any one or more selected from an epoxy acrylate, a urethane acrylate, an ester acrylate, a copolymerized acrylate, a butadiene acrylate, a silicone acrylate, and an amino resin acrylate each having a vinyl group.

11. The matched-type electromagnetic wave absorber according to claim 3, wherein
the component (A): acrylic polymerizable resin contains any one or more selected from an epoxy acrylate, a urethane acrylate, an ester acrylate, a copolymerized acrylate, a butadiene acrylate, a silicone acrylate, and an amino resin acrylate each having a vinyl group.

12. The matched-type electromagnetic wave absorber according to claim 4, wherein
the component (A): acrylic polymerizable resin contains any one or more selected from an epoxy acrylate, a urethane acrylate, an ester acrylate, a copolymerized acrylate, a butadiene acrylate, a silicone acrylate, and an amino resin acrylate each having a vinyl group.

13. The matched-type electromagnetic wave absorber according to claim 2, wherein
the component (D) is a material different from the component (C).

14. The matched-type electromagnetic wave absorber according to claim 3, wherein
the component (D) is a material different from the component (C).

15. The matched-type electromagnetic wave absorber according to claim 5, wherein
the component (D) is a material different from the component (C).

16. The matched-type electromagnetic wave absorber according to claim 6, wherein
the component (D) is a material different from the component (C).

17. The matched-type electromagnetic wave absorber according to claim 7, wherein
the component (D) is a material different from the component (C).

18. The matched-type electromagnetic wave absorber according to claim 1, wherein
the component (D) is particles of which an average particle diameter is ranged from 0.01 to 10 μm.

* * * * *